(12) United States Patent
Pinarbasi et al.

(10) Patent No.: US 10,840,439 B2
(45) Date of Patent: Nov. 17, 2020

(54) MAGNETIC TUNNEL JUNCTION (MTJ) FABRICATION METHODS AND SYSTEMS

(71) Applicant: SPIN MEMORY, Inc., Fremont, CA (US)

(72) Inventors: Mustafa Pinarbasi, Fremont, CA (US); Thomas Boone, Fremont, CA (US); Pirachi Shrivastava, Fremont, CA (US); Pradeep Manandhar, Fremont, CA (US)

(73) Assignee: Spin Memory, Inc., Fremont, CA (US)

( * ) Notice: Subject to any disclaimer, the term of this patent is extended or adjusted under 35 U.S.C. 154(b) by 199 days.

(21) Appl. No.: 15/859,133

(22) Filed: Dec. 29, 2017

(65) Prior Publication Data

US 2019/0207103 A1    Jul. 4, 2019

(51) Int. Cl.

| | |
|---|---|
| *H01L 43/12* | (2006.01) |
| *H01L 43/08* | (2006.01) |
| *H01L 21/308* | (2006.01) |
| *H01L 27/22* | (2006.01) |
| *H01L 21/3065* | (2006.01) |
| *H01L 43/02* | (2006.01) |

(52) U.S. Cl.
CPC ............ *H01L 43/12* (2013.01); *H01L 21/308* (2013.01); *H01L 21/3065* (2013.01); *H01L 27/222* (2013.01); *H01L 27/228* (2013.01); *H01L 43/02* (2013.01); *H01L 43/08* (2013.01)

(58) Field of Classification Search
CPC .... H01L 43/12; H01L 21/3065; H01L 21/308
See application file for complete search history.

(56) References Cited

U.S. PATENT DOCUMENTS

| 4,597,487 A | 7/1986 | Crosby et al. |
|---|---|---|
| 5,541,868 A | 7/1996 | Prinz |
| 5,559,952 A | 9/1996 | Fujimoto |

(Continued)

FOREIGN PATENT DOCUMENTS

| CA | 2766141 | 1/2011 |
|---|---|---|
| CN | 105706259 | 6/2016 |

(Continued)

OTHER PUBLICATIONS

US 7,026,672 B2, 04/2006, Grandis (withdrawn)

(Continued)

*Primary Examiner* — Errol V Fernandes

(57) ABSTRACT

Embodiments of the present invention facilitate efficient and effective increased memory cell density configuration. In one embodiment, the method comprises: forming a first pitch reference component and a second pitch reference component; forming a first pillar magnetic tunnel junction (pMTJ) located in a first level and a second pMTJ located in a second level, wherein the location of the second pMTJ with respect to the first pMTJ is coordinated based upon a reference pitch distance between the first pitch reference component and first pitch reference component. In one exemplary implementation, the first pitch reference component is a first switch coupled to the first pMTJ and the second pitch reference component is a second switch coupled to the second pMTJ. The reference component size can be based upon a minimum lithographic processing dimension.

23 Claims, 12 Drawing Sheets

(56) References Cited

U.S. PATENT DOCUMENTS

| | | |
|---|---|---|
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |
| 5,732,016 A | 3/1998 | Chen et al. |
| 5,751,647 A | 5/1998 | O'Toole |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,064,948 A | 5/2000 | West |
| 6,075,941 A | 6/2000 | Itoh |
| 6,097,579 A | 8/2000 | Gill |
| 6,112,295 A | 8/2000 | Bhamidipati et al. |
| 6,124,711 A | 9/2000 | Tanaka et al. |
| 6,134,138 A | 10/2000 | Lu et al. |
| 6,140,838 A | 10/2000 | Johnson |
| 6,154,139 A | 11/2000 | Kanai et al. |
| 6,154,349 A | 11/2000 | Kanai et al. |
| 6,172,902 B1 | 1/2001 | Wegrowe et al. |
| 6,233,172 B1 | 5/2001 | Chen et al. |
| 6,233,690 B1 | 5/2001 | Choi et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,442,681 B1 | 8/2002 | Ryan et al. |
| 6,447,935 B1 | 9/2002 | Zhang et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,903 B1 | 4/2003 | Savtchenko et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,608,776 B2 | 8/2003 | Hidaka |
| 6,635,367 B2 | 10/2003 | Igarashi et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,731,537 B2 | 5/2004 | Kanamori |
| 6,744,086 B2 | 6/2004 | Daughton et al. |
| 6,750,491 B2 | 6/2004 | Sharma et al. |
| 6,751,074 B2 | 6/2004 | Inomata et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,807,091 B2 | 10/2004 | Saito |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,839,821 B2 | 1/2005 | Estakhri |
| 6,842,317 B2 | 1/2005 | Sugita et al. |
| 6,842,366 B2 | 1/2005 | Chan |
| 6,847,547 B2 | 1/2005 | Albert et al. |
| 6,879,512 B2 | 4/2005 | Luo |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,936,479 B2 | 8/2005 | Sharma |
| 6,938,142 B2 | 8/2005 | Pawlowski |
| 6,956,257 B2 | 10/2005 | Zhu et al. |
| 6,958,507 B2 | 10/2005 | Atwood et al. |
| 6,958,927 B1 | 10/2005 | Nguyen et al. |
| 6,967,863 B2 | 11/2005 | Huai |
| 6,980,469 B2 | 12/2005 | Kent et al. |
| 6,984,529 B2 | 1/2006 | Stojakovic et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,339 B2 | 2/2006 | Kawabata et al. |
| 7,002,839 B2 | 2/2006 | Kawabata et al. |
| 7,005,958 B2 | 2/2006 | Wan |
| 7,006,371 B2 | 2/2006 | Matsuoka |
| 7,006,375 B2 | 2/2006 | Covington |
| 7,009,877 B1 | 3/2006 | Huai et al. |
| 7,033,126 B2 | 4/2006 | Van Den Berg |
| 7,041,598 B2 | 5/2006 | Sharma |
| 7,045,368 B2 | 5/2006 | Hong et al. |
| 7,054,119 B2 | 5/2006 | Sharma et al. |
| 7,057,922 B2 | 6/2006 | Fukumoto |
| 7,095,646 B2 | 8/2006 | Slaughter et al. |
| 7,098,494 B2 | 8/2006 | Pakala et al. |
| 7,106,624 B2 | 9/2006 | Huai et al. |
| 7,110,287 B2 | 9/2006 | Huai et al. |
| 7,149,106 B2 | 12/2006 | Mancoff et al. |
| 7,161,829 B2 | 1/2007 | Huai et al. |
| 7,170,778 B2 | 1/2007 | Kent et al. |
| 7,187,577 B1 | 3/2007 | Wang |
| 7,190,611 B2 | 3/2007 | Nguyen et al. |
| 7,203,129 B2 | 4/2007 | Lin et al. |
| 7,203,802 B2 | 4/2007 | Huras |
| 7,227,773 B1 | 6/2007 | Nguyen et al. |
| 7,233,039 B2 | 6/2007 | Huai et al. |
| 7,242,045 B2 | 7/2007 | Nguyen et al. |
| 7,245,462 B2 | 7/2007 | Huai et al. |
| 7,262,941 B2 | 8/2007 | Li et al. |
| 7,273,780 B2 | 9/2007 | Kim |
| 7,283,333 B2 | 10/2007 | Gill |
| 7,307,876 B2 | 12/2007 | Kent et al. |
| 7,313,015 B2 | 12/2007 | Bessho |
| 7,324,387 B1 | 1/2008 | Bergemont et al. |
| 7,324,389 B2 | 1/2008 | Cernea |
| 7,335,960 B2 | 2/2008 | Han et al. |
| 7,351,594 B2 | 4/2008 | Bae et al. |
| 7,352,021 B2 | 4/2008 | Bae et al. |
| 7,369,427 B2 | 5/2008 | Dia et al. |
| 7,372,722 B2 | 5/2008 | Jeong |
| 7,376,006 B2 | 5/2008 | Bednorz et al. |
| 7,386,765 B2 | 6/2008 | Ellis |
| 7,404,017 B2 | 7/2008 | Kuo |
| 7,421,535 B2 | 9/2008 | Jarvis et al. |
| 7,436,699 B2 | 10/2008 | Tanizaki |
| 7,449,345 B2 | 11/2008 | Horng et al. |
| 7,453,719 B2 | 11/2008 | Sakimura |
| 7,476,919 B2 | 1/2009 | Hong et al. |
| 7,502,249 B1 | 3/2009 | Ding |
| 7,502,253 B2 | 3/2009 | Rizzo |
| 7,508,042 B2 | 3/2009 | Gun |
| 7,511,985 B2 | 3/2009 | Horii |
| 7,515,458 B2 | 4/2009 | Hung et al. |
| 7,515,485 B2 | 4/2009 | Lee |
| 7,532,503 B2 | 5/2009 | Morise et al. |
| 7,541,117 B2 | 6/2009 | Ogawa |
| 7,542,326 B2 | 6/2009 | Yoshimura |
| 7,573,737 B2 | 8/2009 | Kent et al. |
| 7,576,956 B2 | 8/2009 | Huai |
| 7,582,166 B2 | 9/2009 | Lampe |
| 7,598,555 B1 | 10/2009 | Papworth Parkin |
| 7,602,000 B2 | 10/2009 | Sun et al. |
| 7,619,431 B2 | 11/2009 | DeWilde et al. |
| 7,633,800 B2 | 12/2009 | Adusumilli et al. |
| 7,642,612 B2 | 1/2010 | Intili et al. |
| 7,660,161 B2 | 2/2010 | Van Tran |
| 7,663,171 B2 | 2/2010 | Inokuchi et al. |

(56) References Cited

U.S. PATENT DOCUMENTS

| | | |
|---|---|---|
| 7,675,792 B2 | 3/2010 | Bedeschi |
| 7,696,551 B2 | 4/2010 | Xiao |
| 7,733,699 B2 | 6/2010 | Roohparvar |
| 7,739,559 B2 | 6/2010 | Suzuki et al. |
| 7,773,439 B2 | 8/2010 | Do et al. |
| 7,776,665 B2 | 8/2010 | Izumi et al. |
| 7,796,439 B2 | 9/2010 | Arai |
| 7,810,017 B2 | 10/2010 | Radke |
| 7,821,818 B2 | 10/2010 | Dieny et al. |
| 7,852,662 B2 | 12/2010 | Yang |
| 7,861,141 B2 | 12/2010 | Chen |
| 7,881,095 B2 | 2/2011 | Lu |
| 7,911,832 B2 | 3/2011 | Kent et al. |
| 7,916,515 B2 | 3/2011 | Li |
| 7,936,595 B2 | 5/2011 | Han et al. |
| 7,936,598 B2 | 5/2011 | Zheng et al. |
| 7,983,077 B2 | 7/2011 | Park |
| 7,986,544 B2 | 7/2011 | Kent et al. |
| 8,008,095 B2 | 8/2011 | Assefa et al. |
| 8,028,119 B2 | 9/2011 | Miura |
| 8,041,879 B2 | 10/2011 | Erez |
| 8,055,957 B2 | 11/2011 | Kondo |
| 8,058,925 B2 | 11/2011 | Rasmussen |
| 8,059,460 B2 | 11/2011 | Jeong et al. |
| 8,072,821 B2 | 12/2011 | Arai |
| 8,077,496 B2 | 12/2011 | Choi |
| 8,080,365 B2 | 12/2011 | Nozaki |
| 8,088,556 B2 | 1/2012 | Nozaki |
| 8,094,480 B2 | 1/2012 | Tonomura |
| 8,102,701 B2 | 1/2012 | Prejbeanu et al. |
| 8,105,948 B2 | 1/2012 | Zhong et al. |
| 8,120,949 B2 | 2/2012 | Ranjan et al. |
| 8,143,683 B2 | 3/2012 | Wang et al. |
| 8,144,509 B2 | 3/2012 | Jung |
| 8,148,970 B2 | 4/2012 | Fuse |
| 8,159,867 B2 | 4/2012 | Cho et al. |
| 8,201,024 B2 | 6/2012 | Burger |
| 8,223,534 B2 | 7/2012 | Chung |
| 8,255,742 B2 | 8/2012 | Ipek |
| 8,278,996 B2 | 10/2012 | Miki |
| 8,279,666 B2 | 10/2012 | Dieny et al. |
| 8,295,073 B2 | 10/2012 | Norman |
| 8,295,082 B2 | 10/2012 | Chua-Eoan |
| 8,334,213 B2 | 12/2012 | Mao |
| 8,345,474 B2 | 1/2013 | Oh |
| 8,349,536 B2 | 1/2013 | Nozaki |
| 8,362,580 B2 | 1/2013 | Chen et al. |
| 8,363,465 B2 | 1/2013 | Kent et al. |
| 8,374,050 B2 | 2/2013 | Zhou et al. |
| 8,386,836 B2 | 2/2013 | Burger |
| 8,415,650 B2 | 4/2013 | Greene |
| 8,416,620 B2 | 4/2013 | Zheng et al. |
| 8,422,286 B2 | 4/2013 | Ranjan et al. |
| 8,422,330 B2 | 4/2013 | Hatano et al. |
| 8,432,727 B2 | 4/2013 | Ryu |
| 8,441,844 B2 | 5/2013 | El Baraji |
| 8,456,883 B1 | 6/2013 | Liu |
| 8,456,926 B2 | 6/2013 | Ong et al. |
| 8,477,530 B2 | 7/2013 | Ranjan et al. |
| 8,492,381 B2 | 7/2013 | Kuroiwa et al. |
| 8,492,881 B2 | 7/2013 | Kuroiwa et al. |
| 8,495,432 B2 | 7/2013 | Dickens |
| 8,535,952 B2 | 9/2013 | Ranjan et al. |
| 8,539,303 B2 | 9/2013 | Lu |
| 8,542,524 B2 | 9/2013 | Keshtbod et al. |
| 8,549,303 B2 | 10/2013 | Fifield et al. |
| 8,558,334 B2 | 10/2013 | Ueki et al. |
| 8,559,215 B2 | 10/2013 | Zhou et al. |
| 8,574,928 B2 | 11/2013 | Satoh et al. |
| 8,582,353 B2 | 11/2013 | Lee |
| 8,590,139 B2 | 11/2013 | Op DeBeeck et al. |
| 8,592,927 B2 | 11/2013 | Jan |
| 8,593,868 B2 | 11/2013 | Park |
| 8,609,439 B2 | 12/2013 | Prejbeanu et al. |
| 8,617,408 B2 | 12/2013 | Balamane |
| 8,625,339 B2 | 1/2014 | Ong |
| 8,634,232 B2 | 1/2014 | Oh |
| 8,667,331 B2 | 3/2014 | Hori |
| 8,687,415 B2 | 4/2014 | Parkin et al. |
| 8,705,279 B2 | 4/2014 | Kim |
| 8,716,817 B2 | 5/2014 | Saida |
| 8,716,818 B2 | 5/2014 | Yoshikawa et al. |
| 8,722,543 B2 | 5/2014 | Belen |
| 8,737,137 B1 | 5/2014 | Choy et al. |
| 8,755,222 B2 | 6/2014 | Kent et al. |
| 8,779,410 B2 | 7/2014 | Sato et al. |
| 8,780,617 B2 | 7/2014 | Kang |
| 8,792,269 B1 | 7/2014 | Abedifard |
| 8,802,451 B2 | 8/2014 | Malmhall |
| 8,810,974 B2 | 8/2014 | Noel et al. |
| 8,817,525 B2 | 8/2014 | Ishihara |
| 8,832,530 B2 | 9/2014 | Pangal et al. |
| 8,852,760 B2 | 10/2014 | Wang et al. |
| 8,853,807 B2 | 10/2014 | Son et al. |
| 8,860,156 B2 | 10/2014 | Beach et al. |
| 8,862,808 B2 | 10/2014 | Tsukamoto et al. |
| 8,867,258 B2 | 10/2014 | Rao |
| 8,883,520 B2 | 11/2014 | Satoh et al. |
| 8,902,628 B2 | 12/2014 | Ha |
| 8,966,345 B2 | 2/2015 | Wilkerson |
| 8,987,849 B2 | 3/2015 | Jan |
| 9,019,754 B1 | 4/2015 | Bedeschi |
| 9,025,378 B2 | 5/2015 | Tokiwa |
| 9,026,888 B2 | 5/2015 | Kwok |
| 9,030,899 B2 | 5/2015 | Lee |
| 9,036,407 B2 | 5/2015 | Wang et al. |
| 9,037,812 B2 | 5/2015 | Chew |
| 9,043,674 B2 | 5/2015 | Wu |
| 9,070,441 B2 | 6/2015 | Otsuka et al. |
| 9,070,855 B2 | 6/2015 | Gan et al. |
| 9,076,530 B2 | 7/2015 | Gomez et al. |
| 9,082,888 B2 | 7/2015 | Kent et al. |
| 9,104,581 B2 | 8/2015 | Fee et al. |
| 9,104,595 B2 | 8/2015 | Sah |
| 9,130,155 B2 | 9/2015 | Chepulskyy et al. |
| 9,136,463 B2 | 9/2015 | Li |
| 9,140,247 B2 | 9/2015 | Kim |
| 9,165,629 B2 | 10/2015 | Chih |
| 9,165,787 B2 | 10/2015 | Kang |
| 9,166,155 B2 | 10/2015 | Deshpande |
| 9,178,958 B2 | 11/2015 | Lindamood |
| 9,189,326 B2 | 11/2015 | Kalamatianos |
| 9,190,471 B2 | 11/2015 | Yi et al. |
| 9,196,332 B2 | 11/2015 | Zhang et al. |
| 9,229,306 B2 | 1/2016 | Mekhanik et al. |
| 9,229,853 B2 | 1/2016 | Khan |
| 9,231,191 B2 | 1/2016 | Huang et al. |
| 9,245,608 B2 | 1/2016 | Chen et al. |
| 9,250,990 B2 | 2/2016 | Motwani |
| 9,250,997 B2 | 2/2016 | Kim et al. |
| 9,251,896 B2 | 2/2016 | Ikeda |
| 9,257,483 B2 | 2/2016 | Ishigaki |
| 9,263,667 B1 | 2/2016 | Pinarbasi |
| 9,286,186 B2 | 3/2016 | Weiss |
| 9,298,552 B2 | 3/2016 | Leem |
| 9,299,412 B2 | 3/2016 | Naelmi |
| 9,317,429 B2 | 4/2016 | Ramanujan |
| 9,324,457 B2 | 4/2016 | Takizawa |
| 9,337,412 B2 | 5/2016 | Pinarbasi et al. |
| 9,341,939 B1 | 5/2016 | Yu et al. |
| 9,342,403 B2 | 5/2016 | Keppel et al. |
| 9,349,482 B2 | 5/2016 | Kim et al. |
| 9,351,899 B2 | 5/2016 | Bose et al. |
| 9,362,486 B2 | 6/2016 | Kim et al. |
| 9,378,817 B2 | 6/2016 | Kawai |
| 9,379,314 B2 | 6/2016 | Park et al. |
| 9,389,954 B2 | 7/2016 | Pelley et al. |
| 9,396,065 B2 | 7/2016 | Webb et al. |
| 9,396,991 B2 | 7/2016 | Arvin et al. |
| 9,401,336 B2 | 7/2016 | Arvin et al. |
| 9,406,876 B2 | 8/2016 | Pinarbasi |
| 9,418,721 B2 | 8/2016 | Bose |
| 9,431,084 B2 | 8/2016 | Bose et al. |
| 9,449,720 B1 | 9/2016 | Lung |

(56) References Cited

U.S. PATENT DOCUMENTS

| | | |
|---|---|---|
| 9,450,180 B1 | 9/2016 | Annunziata |
| 9,455,013 B2 | 9/2016 | Kim |
| 9,466,789 B2 | 10/2016 | Wang et al. |
| 9,472,282 B2 | 10/2016 | Lee |
| 9,472,748 B2 | 10/2016 | Kuo et al. |
| 9,484,527 B2 | 11/2016 | Han et al. |
| 9,488,416 B2 | 11/2016 | Fujita et al. |
| 9,490,054 B2 | 11/2016 | Jan |
| 9,508,456 B1 | 11/2016 | Shim |
| 9,520,128 B2 | 12/2016 | Bauer et al. |
| 9,520,192 B2 | 12/2016 | Naeimi et al. |
| 9,548,116 B2 | 1/2017 | Roy |
| 9,548,445 B2 | 1/2017 | Lee et al. |
| 9,553,102 B2 | 1/2017 | Wang |
| 9,583,167 B2 | 2/2017 | Chung |
| 9,594,683 B2 | 3/2017 | Dittrich |
| 9,600,183 B2 | 3/2017 | Tomishima et al. |
| 9,608,038 B2 | 3/2017 | Wang et al. |
| 9,614,007 B2 | 4/2017 | Boniardi |
| 9,634,237 B2 | 4/2017 | Lee et al. |
| 9,640,267 B2 | 5/2017 | Tani |
| 9,646,701 B2 | 5/2017 | Lee |
| 9,652,321 B2 | 5/2017 | Motwani |
| 9,662,925 B2 | 5/2017 | Raksha et al. |
| 9,697,140 B2 | 7/2017 | Kwok |
| 9,720,616 B2 | 8/2017 | Yu |
| 9,728,712 B2 | 8/2017 | Kardasz et al. |
| 9,741,926 B1 | 8/2017 | Pinarbasi et al. |
| 9,772,555 B2 | 9/2017 | Park et al. |
| 9,773,974 B2 | 9/2017 | Pinarbasi et al. |
| 9,780,300 B2 | 10/2017 | Zhou et al. |
| 9,793,319 B2 | 10/2017 | Gan et al. |
| 9,853,006 B2 | 12/2017 | Arvin et al. |
| 9,853,206 B2 | 12/2017 | Pinarbasi et al. |
| 9,853,292 B2 | 12/2017 | Loveridge et al. |
| 9,858,976 B2 | 1/2018 | Ikegami |
| 9,859,333 B2 | 1/2018 | Kim et al. |
| 9,865,806 B2 | 1/2018 | Choi et al. |
| 9,935,258 B2 | 4/2018 | Chen et al. |
| 10,008,662 B2 | 6/2018 | You |
| 10,026,609 B2 | 7/2018 | Sreenivasan et al. |
| 10,038,137 B2 | 7/2018 | Chuang |
| 10,042,588 B2 | 8/2018 | Kang |
| 10,043,851 B1 | 8/2018 | Shen |
| 10,043,967 B2 | 8/2018 | Chen |
| 10,062,837 B2 | 8/2018 | Kim et al. |
| 10,115,446 B1 | 10/2018 | Louie et al. |
| 10,134,988 B2 | 11/2018 | Fennimore et al. |
| 10,163,479 B2 | 12/2018 | Berger et al. |
| 10,186,614 B2 | 1/2019 | Asami |
| 2002/0090533 A1 | 7/2002 | Zhang et al. |
| 2002/0105823 A1 | 8/2002 | Redon et al. |
| 2003/0085186 A1 | 5/2003 | Fujioka |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0026369 A1 | 2/2004 | Ying |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0173315 A1 | 9/2004 | Leung |
| 2004/0257717 A1 | 12/2004 | Sharma et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0018057 A1 | 1/2006 | Huai |
| 2006/0049472 A1 | 3/2006 | Diao et al. |
| 2006/0077734 A1 | 4/2006 | Fong |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0096229 A1 | 5/2007 | Yoshikawa |
| 2007/0242501 A1 | 10/2007 | Hung et al. |
| 2008/0049488 A1 | 2/2008 | Rizzo |
| 2008/0079530 A1 | 4/2008 | Weidman et al. |
| 2008/0112094 A1 | 5/2008 | Kent et al. |
| 2008/0151614 A1 | 6/2008 | Guo |
| 2008/0259508 A2 | 10/2008 | Kent et al. |
| 2008/0297292 A1 | 12/2008 | Viala et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0146231 A1 | 6/2009 | Kuper et al. |
| 2009/0161421 A1 | 6/2009 | Cho et al. |
| 2009/0209102 A1 | 8/2009 | Zhong et al. |
| 2009/0231909 A1 | 9/2009 | Dieny et al. |
| 2010/0019297 A1 | 1/2010 | Hwang |
| 2010/0124091 A1 | 5/2010 | Cowburn |
| 2010/0162065 A1 | 6/2010 | Norman |
| 2010/0193891 A1 | 8/2010 | Wang et al. |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2011/0032645 A1 | 2/2011 | Noel et al. |
| 2011/0058412 A1 | 3/2011 | Zheng et al. |
| 2011/0061786 A1 | 3/2011 | Mason |
| 2011/0089511 A1 | 4/2011 | Keshtbod et al. |
| 2011/0133298 A1 | 6/2011 | Chen et al. |
| 2012/0052258 A1 | 3/2012 | Op DeBeeck et al. |
| 2012/0069649 A1 | 3/2012 | Ranjan et al. |
| 2012/0155156 A1 | 6/2012 | Watts |
| 2012/0155158 A1 | 6/2012 | Higo |
| 2012/0181642 A1 | 7/2012 | Prejbeanu et al. |
| 2012/0188818 A1 | 7/2012 | Ranjan et al. |
| 2012/0280336 A1 | 11/2012 | Jan et al. |
| 2012/0280339 A1 | 11/2012 | Zhang et al. |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0244344 A1 | 9/2013 | Malmhall et al. |
| 2013/0267042 A1 | 10/2013 | Satoh et al. |
| 2013/0270661 A1 | 10/2013 | Yi et al. |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0042571 A1 | 2/2014 | Gan et al. |
| 2014/0070341 A1 | 3/2014 | Beach et al. |
| 2014/0103472 A1 | 4/2014 | Kent et al. |
| 2014/0136870 A1 | 5/2014 | Breternitz et al. |
| 2014/0151837 A1 | 6/2014 | Ryu |
| 2014/0169085 A1 | 6/2014 | Wang et al. |
| 2014/0175583 A1* | 6/2014 | Doyle .............. H01L 43/08 257/427 |
| 2014/0177316 A1 | 6/2014 | Otsuka et al. |
| 2014/0217531 A1 | 8/2014 | Jan |
| 2014/0252439 A1 | 9/2014 | Guo |
| 2014/0264671 A1 | 9/2014 | Chepulskyy et al. |
| 2014/0281284 A1 | 9/2014 | Block et al. |
| 2015/0056368 A1 | 2/2015 | Wang et al. |
| 2015/0279904 A1 | 10/2015 | Pinarbasi et al. |
| 2016/0087193 A1 | 3/2016 | Pinarbasi et al. |
| 2016/0163973 A1 | 6/2016 | Pinarbasi |
| 2016/0218278 A1 | 7/2016 | Pinarbasi et al. |
| 2016/0283385 A1 | 9/2016 | Boyd et al. |
| 2016/0315118 A1 | 10/2016 | Kardasz et al. |
| 2016/0378592 A1 | 12/2016 | Ikegami et al. |
| 2017/0062712 A1 | 3/2017 | Choi et al. |
| 2017/0123991 A1 | 5/2017 | Sela et al. |

(56) References Cited

U.S. PATENT DOCUMENTS

| | | |
|---|---|---|
| 2017/0133104 A1 | 5/2017 | Darbari et al. |
| 2017/0199459 A1 | 7/2017 | Ryu et al. |
| 2017/0256584 A1 | 9/2017 | Sanuki |
| 2018/0033957 A1 | 2/2018 | Zhang |
| 2018/0097006 A1 | 4/2018 | Kim et al. |
| 2018/0114589 A1 | 4/2018 | El-Baraji et al. |
| 2018/0119278 A1 | 5/2018 | Kornmeyer |
| 2018/0121117 A1 | 5/2018 | Berger et al. |
| 2018/0121355 A1 | 5/2018 | Berger et al. |
| 2018/0121361 A1 | 5/2018 | Berger et al. |
| 2018/0122446 A1 | 5/2018 | Berger et al. |
| 2018/0122447 A1 | 5/2018 | Berger et al. |
| 2018/0122448 A1 | 5/2018 | Berger et al. |
| 2018/0122449 A1 | 5/2018 | Berger et al. |
| 2018/0122450 A1 | 5/2018 | Berger et al. |
| 2018/0130945 A1 | 5/2018 | Choi et al. |
| 2018/0211821 A1 | 7/2018 | Kogler |
| 2018/0233362 A1 | 8/2018 | Glodde |
| 2018/0233363 A1 | 8/2018 | Glodde |
| 2018/0248110 A1 | 8/2018 | Kardasz et al. |
| 2018/0248113 A1 | 8/2018 | Pinarbasi et al. |
| 2018/0269254 A1 | 9/2018 | Sugioka |
| 2018/0285714 A1 | 10/2018 | Torng |
| 2018/0286916 A1 | 10/2018 | Wang |
| 2018/0331279 A1 | 11/2018 | Shen |
| 2019/0067566 A1 | 2/2019 | Nagel |
| 2019/0206936 A1 | 7/2019 | Pinarbasi |

FOREIGN PATENT DOCUMENTS

| | | |
|---|---|---|
| EP | 1345277 | 9/2003 |
| FR | 2817998 | 6/2002 |
| FR | 2832542 | 5/2003 |
| FR | 2910716 | 6/2008 |
| JP | H10-004012 | 1/1998 |
| JP | H11-120758 | 4/1999 |
| JP | H11-352867 | 12/1999 |
| JP | 2001-195878 | 7/2001 |
| JP | 2002-261352 | 9/2002 |
| JP | 2002-357489 | 12/2002 |
| JP | 2003-318461 | 11/2003 |
| JP | 2005-044848 | 2/2005 |
| JP | 2005-150482 | 6/2005 |
| JP | 2005-535111 | 11/2005 |
| JP | 2006128579 | 5/2006 |
| JP | 2008-524830 | 7/2008 |
| JP | 2009-027177 | 2/2009 |
| JP | 2013-012546 | 1/2013 |
| JP | 2014-039061 | 2/2014 |
| JP | 5635666 | 12/2014 |
| JP | 2015-002352 | 1/2015 |
| KR | 10-2014-015246 | 9/2014 |
| NO | 2014-062681 | 4/2014 |
| WO | 2009-080636 | 7/2009 |
| WO | 2011-005484 | 1/2011 |

OTHER PUBLICATIONS

Bhatti Sabpreet et al., "Spintronics Based Random Access Memory: a Review," Material Today, Nov. 2107, pp. 530-548, vol. 20, No. 9, Elsevier.

Helia Naeimi, et al., "STTRAM Scaling and Retention Failure," Intel Technology Journal, vol. 17, Issue 1, 2013, pp. 54-75 (22 pages).

S. Ikeda, et al, "A Perpendicular-Anisotropy CoFeB—MgO Magnetic Tunnel Junction", Nature Materials, vol. 9, Sep. 2010, pp. 721-724 (4 pages).

R.H. Kock, et al., "Thermally Assisted Magnetization Reversal in Submicron-Sized Magnetic Thin Films", Physical Review Letters, The American Physical Society, vol. 84, No. 23, Jun. 5, 2000, pp. 5419-5422 (4 pages).

K.J. Lee, et al., "Analytical Investigation of Spin-Transfer Dynamics Using Perpendicular-to-Plane Polarizer", Applied Physics Letters, American Insitute of Physics, vol. 86, (2005), pp. 022505-1 to 022505-3 (3 pages).

Kirsten Martens, et al., "Thermally Induced Magnetic Switching in Thin Ferromagnetic Annuli", NSF grants PHY-0351964 (DLS), 2005, 11 pages.

Kristen Martens, et al., "Magnetic Reversal in Nanoscropic Ferromagnetic Rings", NSF grants PHY-0351964 (DLS) 2005, 23 pages.

"Magnetic Technology Spintronics, Media and Interface", Data Storage Institute, R&D Highlights, Sep. 2010, 3 pages.

Daniel Scott Matic, "A Magnetic Tunnel Junction Compact Model for STT-RAM and MeRAM", Master Thesis University of California, Los Angeles, 2013, pp. 43.

* cited by examiner

910
Switch structures are formed

920
Conductor vias are formed and coupled to the switch structures.

930
MTJ structures or components are formed and coupled to the vias, wherein portions of the MTJ structures are formed in one layer and overlap portions of the MTJ structures that are formed in another layer.

940
Contacts are formed are coupled to the MTJs.

1010
A portion of one memory cell is fabricated in a layer of a semiconductor.

1020
Another portion of the memory cell is fabricated, wherein the other portion is fabricated using a fabrication process that has a second set of fabrication limitations.

FIG 10

1110
Forming a first pitch reference component.

1120
Forming a second pitch reference component.

1130
Forming a first pillar magnetic tunnel junction (pMTJ) located in a first level in the semiconductor device using a first run lithographic process.

1140
Forming a second pillar magnetic tunnel junction (pMTJ) located in a second level in the semiconductor device using a second run lithgraphic process

FIG 11

MAGNETIC TUNNEL JUNCTION (MTJ) FABRICATION METHODS AND SYSTEMS

FIELD OF THE INVENTION

The present invention relates to the field of memory device structure fabrication.

BACKGROUND OF THE INVENTION

Electronic systems and devices have made a significant contribution towards the advancement of modern society and have facilitated increased productivity and reduced costs in analyzing and communicating information in a variety of business, science, education, and entertainment applications. These electronic systems and devices typically include information storage capabilities. Ever greater desire and market pressure for more storage capabilities in smaller devices creates a demand for increased storage component densities. However, as a practical matter there a number of issues (e.g., fabrication considerations, photolithograph capabilities, electrical interference between components, etc.) that limit conventional device component densities.

Some memory devices include storage components that operate based upon electromagnetic principles. Magnetic memory devices typically store information by adjusting and holding magnetic fields within components of the device. Stored information (e.g., bits, logical ones and zeros, true/false indications, etc.) corresponds to a state of the magnetic fields and resulting electrically resistive characteristics. A memory cell that includes a magnetic tunnel junction (MTJ) is one type of magnetic memory structure. A MTJ typically includes ferromagnetic portions separated by a non-magnetic material. The magnetic orientation or spin of a ferromagnetic portion can be altered and results in a change to the electrical resistive characteristics of the device. The change in resistive characteristics can have different impacts on an electric current passing through the structure. The state or characteristics of the current are associated with indications of the stored information.

Limitations on lithographic processes used to create a MTJ are usually the deciding factor in dictating the pitch or distance between memory cells. Given resolution limitations of conventional lithographic processes, the resulting relatively large pitch between conventional MTJ memory cells leads to corresponding limits on traditional density compaction. A MTJ typically has a circular configuration and is referred to as a pillar MTJ (pMTJ). Conventional lithography tools currently can typically print MTJ circles or pillars down to sizes of approximately 70 nm in diameter with 20 nm separation between adjacent MTJs. This results in a conventional pitch of about 90 nm. The size of a traditional MTJ can optionally be trimmed down (e.g., to 20 or 30 nm) to make smaller pillars. However, due to the initial lithographic process placement or separation of the pMTJ (e.g., 90 nm) the density remains substantially the same as the initial pitch limitation even if the MTJ is trimmed. While trimming down from the initial size to a smaller final size may enable improved current or voltage characteristic, trimming traditionally does not help increase density. Thus, traditional memory cell pitch and density improvement is typically limited by lithography capabilities

SUMMARY

Embodiments of the present invention facilitate efficient and effective increased memory cell density configuration.

In one embodiment, a magnetic memory fabrication method comprises: forming a first pitch reference component; forming a second pitch reference component; forming a first pillar magnetic tunnel junction (pMTJ) located in a first level in the semiconductor device using a first run lithographic process; forming a second pillar magnetic tunnel junction (pMTJ) located in a second level in the semiconductor device using a second run lithographic process, wherein the location of the second pMTJ with respect to the first pMTJ is coordinated based upon a reference pitch distance between the first pitch reference component and first pitch reference component. In one exemplary implementation, the first pitch reference component is a first switch coupled to the first pMTJ and the second pitch reference component is a second switch coupled to the second pMTJ. The reference component size can be based upon a minimum lithographic processing dimension. A minimum lithographic processing dimension associated with the first pitch reference component and the second pitch reference component is less than a minimum lithographic processing dimension associated with the first pMTJ and the second pMTJ. The smallest dimension can correspond to a conductive line trace. The pMTJ can be formed using a hard mask and ion beam etch.

The reference component size can be based upon a minimum trimming processing dimension. The first pMTJ and the second pMTJ can also be trimmed. In one exemplary implementation, the first pitch reference component is a first switch coupled to the first pMTJ and the second pitch reference component is a second switch coupled to the second pMTJ. The pMTJs can be formed using a hard mask and ion beam etch. The first switch and second switches can be transistors.

In one embodiment, a memory cell fabrication method comprises: forming a first pMTJ located in a first level in the semiconductor device, wherein the first pMTJ is associated with a first memory cell; and forming a second pMTJ located in a second level in the semiconductor device, wherein the second pMTJ is associated with a second memory cell, wherein the location of the second pMTJ with respect to the first pMTJ is coordinated to comply with a reference pitch. In one exemplary implementation, the method further comprises: forming a first pitch reference component, wherein the first pitch reference component is associated with the first pillar magnetic tunnel junction (pMTJ) memory cell; and forming a second pitch reference component, wherein the second pitch reference component is associated with the first pMTJ memory cell, wherein a pitch between the first pitch reference component and the second pitch reference component is used to determine the reference pitch. In one exemplary implementation, fabrication processes utilized to form the first pitch reference component and the second pitch reference have a greater resolution than fabrication processes utilized to form the first pMTJ and second pMTJ. A portion of the second pMTJ overlaps a portion of the first pMTJ and the overlap is coordinated to comply with a reference pitch associated with other components and an offset in pattern difference between the first level and the second level corresponds to the offset. A first lithographic mask can be utilized to form the first pMTJ and a second lithographic mask can be utilized to form the second pMTJ, wherein lithographic patterns for forming the first pMTJ and second pMTJ are the same except they are offset from one another to correspond to the overlap. In one embodiment, lithographic printing capabilities with respect to the first pitch reference component and the second pitch reference component are used to set the reference pitch.

In one embodiment, a memory cell array formation method comprises: forming a first memory cell with a first magnetic tunnel junction (MTJ) located in a first level, forming a second memory cell with a second magnetic tunnel junction (MTJ) located in a second level, a pitch distance between the second pMTJ and the first pMTJ is based upon the reference pitch. A third component can be included in the first memory cell and a fourth component can be included in the second memory cell, wherein the reference pitch is based upon a pitch between the third component and fourth component. The memory array can be included a magnoresistive random access memory (MRAM). Respective edges of the first pMTJ and second pMTJ can be located with respect to a plane perpendicular to the first and second level. A portion of the first pMTJ and a portion of the second pMTJ can overlap each other and the plane perpendicular to the first and second level traverses the overlap. A portion of the first pMTJ and a portion of the second pMTJ can have a space between each other, and the plane perpendicular to the first and second level and the plane perpendicular to the first and second level traverses the space. Respective edges of the first pMTJ and the second pMTJ can be aligned with the plane perpendicular to the first and second level.

DESCRIPTION OF THE DRAWINGS

The accompanying drawings, which are incorporated in and form a part of this specification, are included for exemplary illustration of the principles of the present invention and not intended to limit the present invention to the particular implementations illustrated therein. The drawings are not to scale unless otherwise specifically indicated.

FIG. 9 is a flow chart of a fabrication method in accordance with one embodiment.

FIG. 10 is a flow chart of a fabrication processes in accordance with one embodiment.

FIG. 11 is a flow chart of an exemplary memory fabrication method in accordance with one embodiment.

DETAILED DESCRIPTION

Figure 1A:
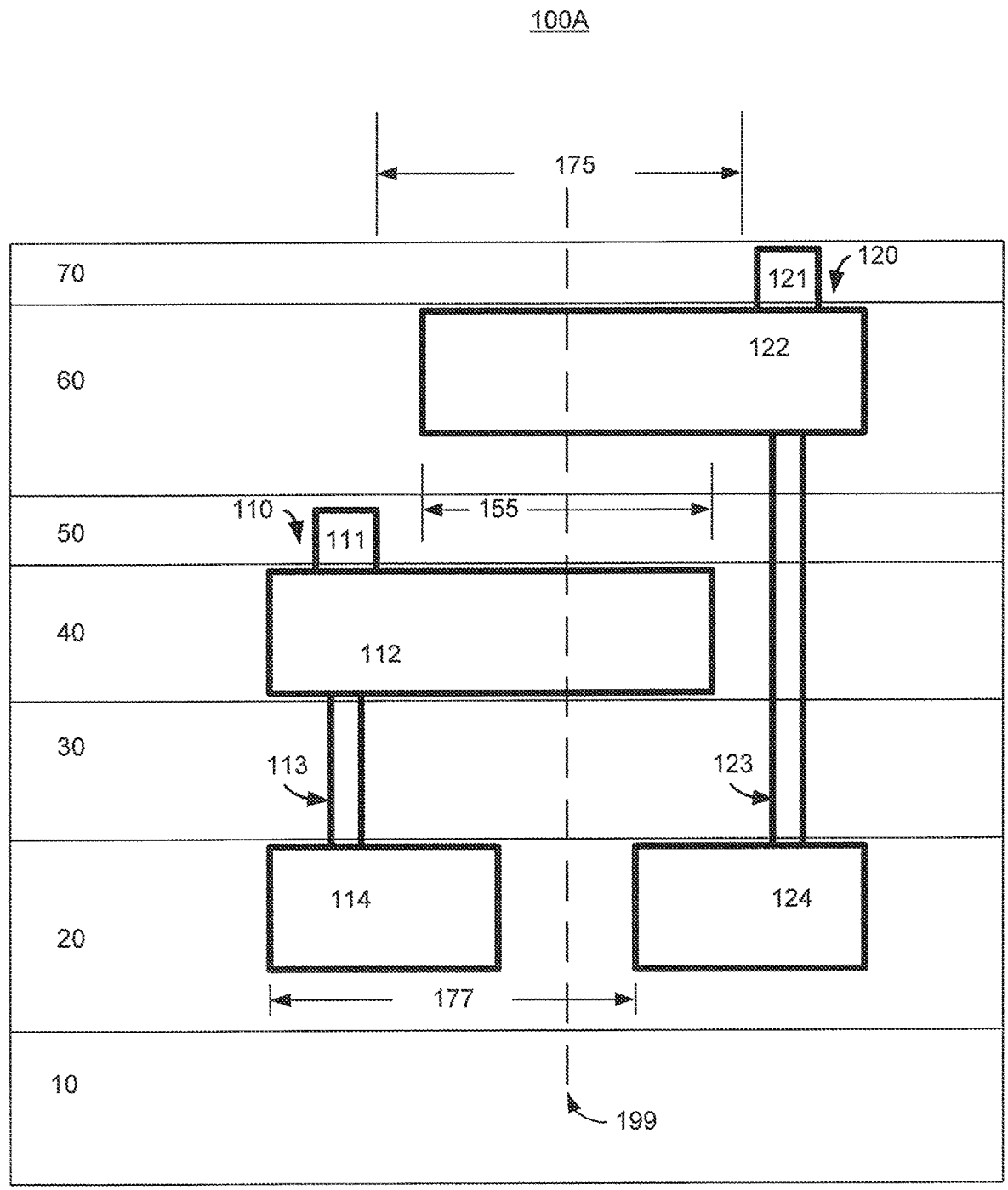
FIG. 1A is a block diagram of an exemplary memory cell configuration in accordance with one embodiment.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Embodiments of the present invention facilitate convenient and efficient increased memory cell density configuration. In one embodiment, a first portion of a first memory cell is located in a first layer and a first portion of a second memory cell is located in a second layer. The first portion of a first memory cell overlaps the first portion of the second memory cell. The first portions of the respective memory cells can be portions of magnetic tunnel junctions (MTJs). In one embodiment, a portion of a MTJ in one memory cell is in one layer of a semiconductor device and a portion of a MTJ in another memory cell is in another layer, wherein the MTJ portions overlap results in decreased pitch between memory cells. The amount of overlap of the MTJs can correspond to a difference between a first minimum lithographic process printing limitation and a second minimum lithographic process printing limitation. The first minimum lithographic process printing limitation can be associated with a MTJ component formation, and the second minimum lithographic process printing limitation can be associated with formation of another component (e.g., a switch, a via, etc.) of the respective memory cells. The other components can be located in a level that is different than the levels that include the MTJs.

It is appreciated MTJs can be included in a variety of devices. In one embodiment, an MTJ is included in magnetoresistive random-access memory (MRAM). The MTJs can have various configurations. In one embodiment, the MTJs can be configured as pillar MTJSs (pMTJs). The pMTJ can be considered a 3D MTJ structure.

Various processes can be utilized to fabricate a memory cell. In one embodiment, a fabrication process utilized to form a portion of a memory cell can have a greater resolution limitation than another fabrication process utilized to form another portion of the memory cell. A portion of one memory cell is fabricated in a layer of a semiconductor and overlaps a portion of another memory cell fabricated in another layer of the semiconductor. The difference in resolution limitations can be due to various aspects of the fabrication processes (e.g., different types of lithographic processes, different shapes of sub-components being formed, etc.). In one exemplary implementation, a fabrication process of a portion of a memory cell has a greater resolution than a fabrication process of another portion of a memory cell. Fabrication of a subcomponent of respective memory cells can have greater resolution capability than fabrication of another subcomponent of the respective memory cells, and a subcomponent with lesser resolution in a memory cell can overlap a subcomponent with lesser resolution in another memory cell. In one embodiment, the portions of sub-components of respective memory cells that overlap are portions of MTJs and other portions (e.g. transistors, vias, etc.) of the memory cell are formed by fabrication processes with greater resolution capabilities than fabrication of the MTJ. It is appreciated the MTJ can be included in a variety of devices. In one embodiment, an MTJ is included in magnetoresistive random-access memory (MRAM).

FIG. 1A is a block diagram of an exemplary memory cell configuration 100A in accordance with one embodiment. Memory cell configuration 100A includes memory cells 110 and 120. Memory cell 110 includes contact 111, pMTJ 112, via 113, and switch 114. Memory cell 120 includes contact 121, pMTJ 122, via 123, and switch 124. The pMTJ 112 is in a different layer than pMTJ 122 and overlap each other. In one exemplary implementation, the overlap 155 is coordinated with a reference pitch. The reference pitch is associated with a pitch between a first pitch reference component in the memory cell 110 and a second pitch reference component in the memory cell 120. In one exemplary implementation, the first pitch reference component is switch 114 and the second pitch reference component is switch 124 and the reference pitch is the distance 177 or pitch between switch 114 and switch 124. In one embodiment, by overlapping the pMTJ 112 and pMTJ 122 in different layers the memory cells can achieve a pitch of 175 from the middle of memory cell 110 to the middle of memory cell 120.

In one embodiment, the lithographic process utilized to create the reference components allows reference components to have a smaller size and pitch than lithographic process limitation utilized to create the pMTJs. Reference components (e.g., switch 114, via 113, etc.) can have a smaller size and pitch than the pMTJs (e.g., 112, etc.) in the x-y plane (e.g., smaller width, length, etc.). In one exemplary implementation, the lithographic process utilized to create the reference components can also allow the space between reference components in the same level or plane to have smaller spacing than a lithographic process utilized to create pMTJs in the same level or plane.

In one embodiment, memory cell configuration 100A includes levels or layers 10, 20, 30, 40, 50, 60, and 70. Contact 121 is included in level 70. The pMTJ 122 is included in level 60. Contact 111 is included in level 50. In one exemplary implementation, level 50 is an interconnection or redistribution layer. The pMTJ 112 is included in layer 40. The vias 113 and 124 are included in layer 30. The switches 114 and 124 are included in layer 20. Layer 10 is a substrate layer. It is appreciated there can be variations to the component and layer configurations. In one exemplary implementation, portions of via 123 are also included in layers 40, 50, and 60 in addition to layer 30. In one exemplary implementation, portions of contact 111 are also included in layers 60 and 70 and extend to be parallel or equal with the top of contact 121. It is appreciated that there can be additional layers (e.g., below, above, in between, etc.) of components. Additional layers can include various components (e.g., pMTJs, vias, switches, lines or traces, other components, etc.).

It is appreciated the relative location or configuration relationship of pMTJs in different levels can vary. In one embodiment, the relative location of the pMTJs is based upon a differences in location with respect to a plane perpendicular to the layers or levels. With reference to FIG. 1, a plane 199 is perpendicular to the layers or levels. In one embodiment, portions of pMTJs in different levels can overlap each other with respect to a plane perpendicular to the levels. In FIG. 1A there is an overlap 155 of the pMTJs 112 and 122. In one exemplary implementation, plane 199 is in or traverses the overlap 155. In one embodiment, the pMTJs in different levels can have a space or gap between each other with respect to a plane perpendicular to the levels.

Figure 1B:
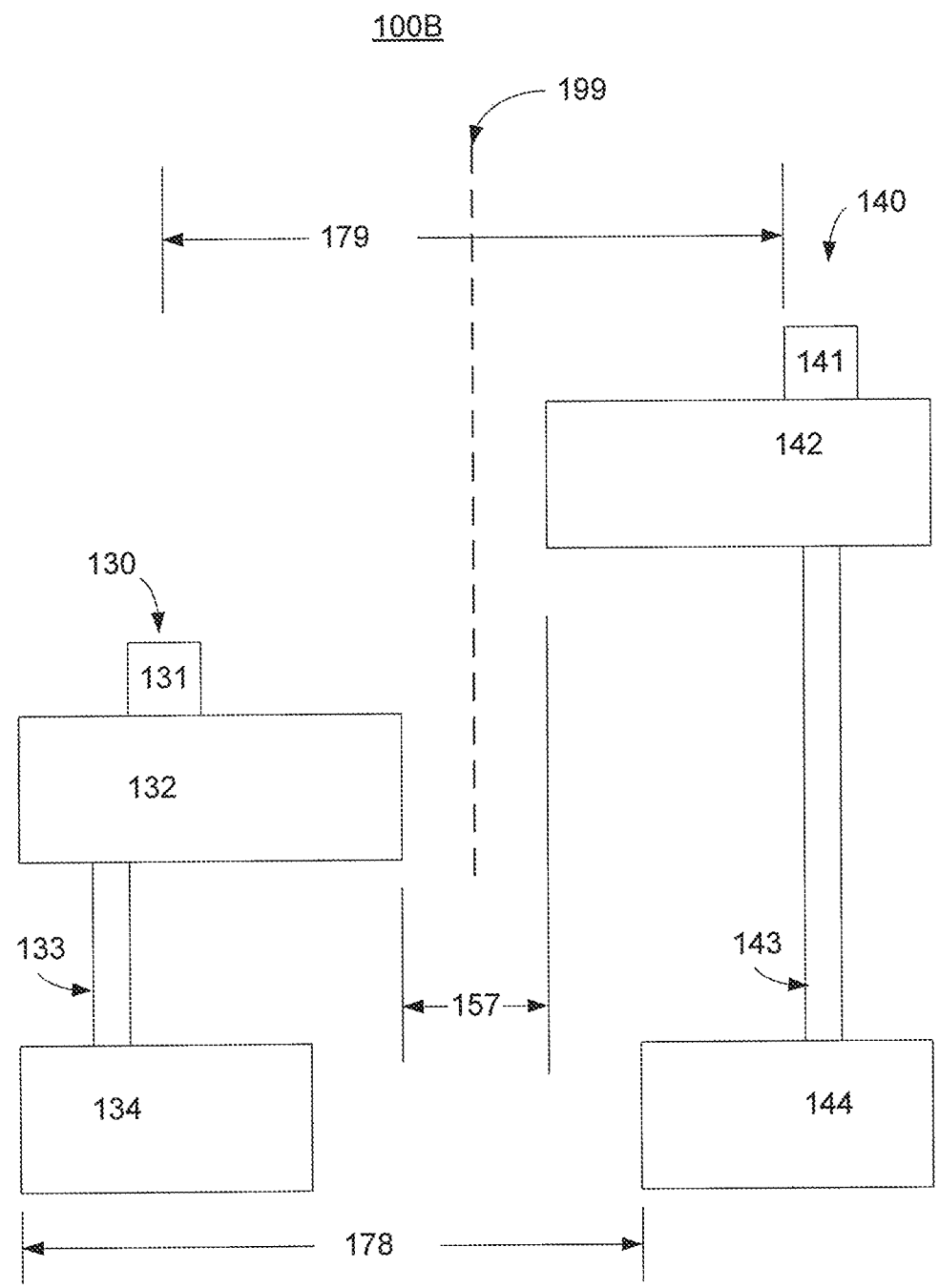
FIG. 1B is a block diagram of another exemplary memory cell configuration in accordance with one embodiment.

FIG. 1B is a block diagram of another exemplary memory cell configuration 100B in accordance with one embodiment. Memory cell configuration 100B is similar to memory cell configuration 100A except a portion of pMTJs in different levels have spacing or gap between pMTJs in different levels. Memory cell configuration 100B includes memory cells 130 and 140. Memory cell 130 includes contact 131, pMTJ 132, via 133, and switch 134. Memory cell 140 includes contact 141, pMTJ 142, via 143, and switch 144. It is appreciated that components of memory cell configuration 100B can be included in multiple layers similar to layers 10 through 70 and so on. The pMTJ 132 is in a different layer than pMTJ 142 but do not overlap each other. In one exemplary implementation, the spacing or gap 157 crossed over a plane 199 perpendicular to the levels. In one exemplary implementation, plane 199 is in or traverses the gap 157. In one exemplary implementation, the spacing or gap 157 is coordinated with or based upon a reference pitch. The reference pitch is associated with a pitch between a first pitch reference component in the memory cell 130 and a second pitch reference component in the memory cell 140. In one exemplary implementation, the first pitch reference component is switch 134 and second pitch reference component is switch 144, and the reference pitch is the distance 178 or pitch between switch 134 and switch 144. In one embodiment, by coordinating the spacing or gap 157 between pMTJ 132 and pMTJ 142 in different layers the memory cells can achieve a pitch of 179 from the middle of memory cell 130 to the middle of memory cell 140.

In one embodiment, an edge in respective pMTJs in different levels can align with one another in a plane perpendicular to the levels. In one embodiment, there is not an overlap or spacing between planes of a respective edge of pMTJs in different levels. In one exemplary implementation, there is no overlap (e.g., distance 155 in FIG. 1A is 0) and no space (e.g., distance 157 in FIG. 1B is 0) between respective edges of pMTJs in different levels.

In one embodiment, respective edges of the first pMTJ and second pMTJ are located with respect to a plane perpendicular to the first and second level. A portion of the first pMTJ and a portion of the second pMTJ can overlap each other and the plane perpendicular to the first and second level traverses the overlap. A portion of the first pMTJ and a portion of the second pMTJ can have a space between each other, and the plane perpendicular to the first and second level traverses the space. The respective edges of the first pMTJ and the second pMTJ can be aligned with the plane perpendicular to the first and second level. In one exemplary implementation, the respective edges are the edges of the pMTJ closest to the plane perpendicular to the levels. The respective edges can be edges of pMTJs closest to a plane similar to plane 199.

Figure 2:
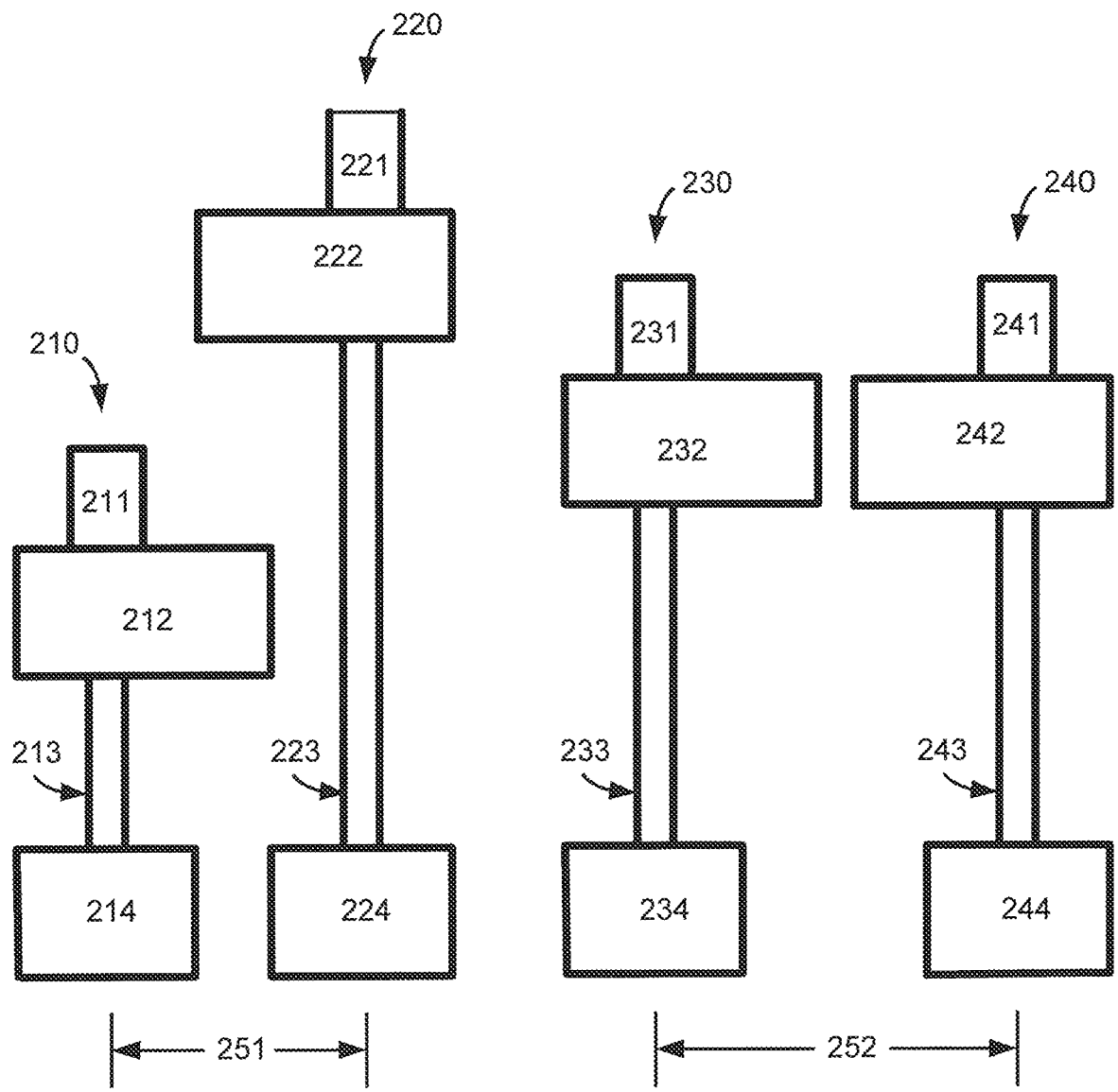
FIG. 2 is a block diagram comparison of exemplary memory cell configurations in accordance with one embodiment.

In one embodiment, a pitch between memory cells with pMTJs in different levels can be smaller than a pitch between memory cells with pMTJs in the same level. FIG. 2 is a block diagram of exemplary comparison of memory cell configurations in accordance with one embodiment. Memory cell 210 includes contact 211, pMTJ 212, via 213 and switch 214. Memory cell 220 includes contact 221, pMTJ 222, via 223 and switch 224. Memory cell 230 includes contact 231, pMTJ 232, via 233 and switch 234. Memory cell 240 includes contact 241, pMTJ 242, via 243 and switch 244. The pMTJs 212 and 222 are in different layers from one another while the pMTJs 232 and 242 are in the same level as one another. By overlapping the pMTJs 212 and 222 in different levels, the pitch 251 between memory cells 210 and 220 is less or smaller than the memory cell pitch 252 between memory cells 230 and 240.

In one embodiment, the pMTJs are included in a MRAM. The pMTJs are coupled to selector switches that are utilized to select or not select the memory cell during various operations (e.g., read, write, erase, etc.). In one exemplary implementation, adjacent switches (in the X and Y directions) are connected to a pMTJ in a different level from one another and portions of the pMTJs can overlap. The resulting reduced memory cell pitch size enables increased memory cell density and higher information or bits/area capacity for an MRAM chip.

Figure 3:
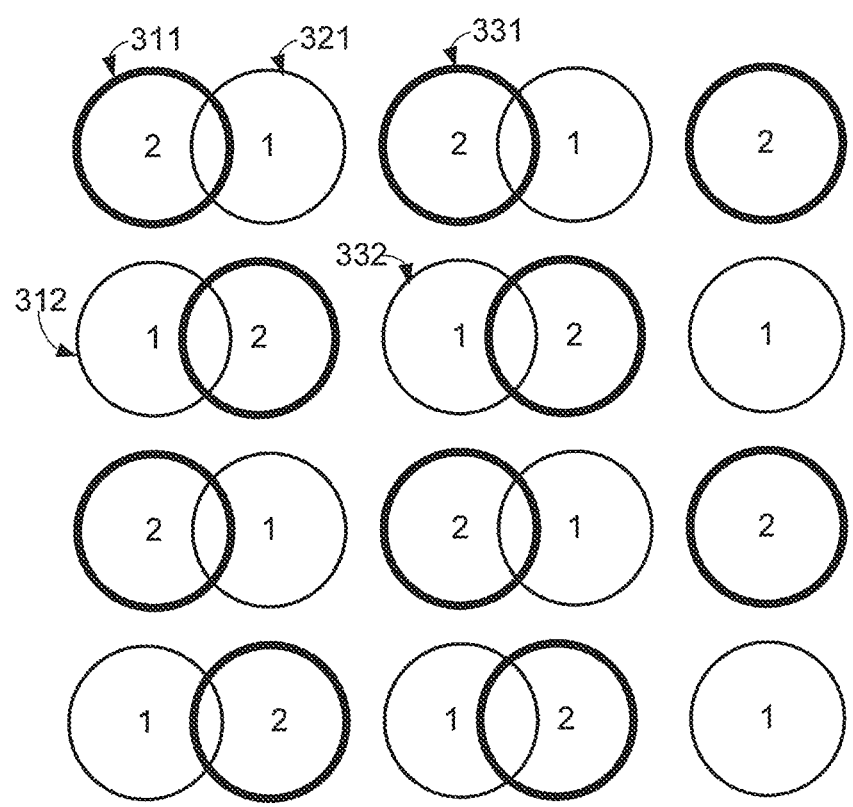
FIG. 3 is a block diagram of a memory array of pMTJ memory cells in which memory pMTJs adjacent to one another in the x and y dimensions alternate between a first level and a second level.

It is appreciated there can be multiple memory cells configured in memory cell arrays. In one embodiment, when viewed in the projection of FIG. 3 which includes multiple planes, pMTJs adjacent to one another in the x and y dimensions (e.g., length and width) are in different levels. In one exemplary implementation, adjacent memory pMTJs alternate levels. FIG. 3 is a block diagram of a memory array of pMTJ memory cells (e.g., 311, 321, 312, etc.) in accordance with one embodiment. The pMTJs adjacent to one another in the x and y dimensions alternate between a first level 1 and second level 2. For example, pMTJ memory cell 311 is in level 2 and pMTJ memory cells 321 and 312 are in level 1.

Figure 4:
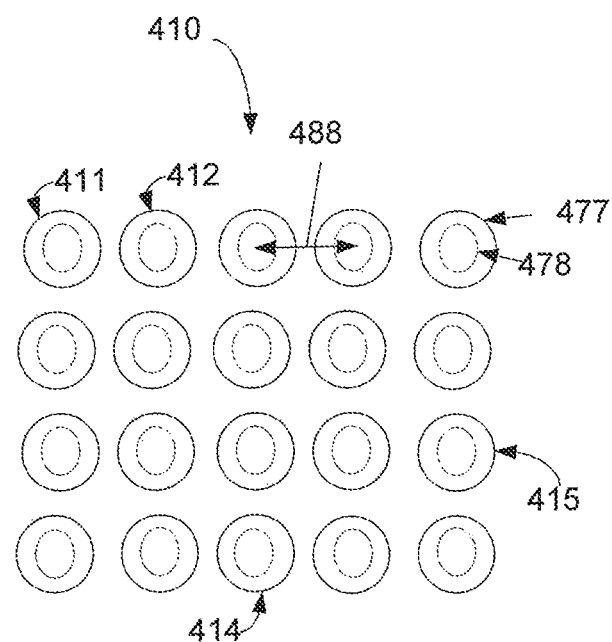
FIG. 4 is a block diagram of an exemplary memory cell array layout without pMTJ overlap and an exemplary memory cell array layout with pMTJ overlap in accordance with one embodiment.
Figure 4:
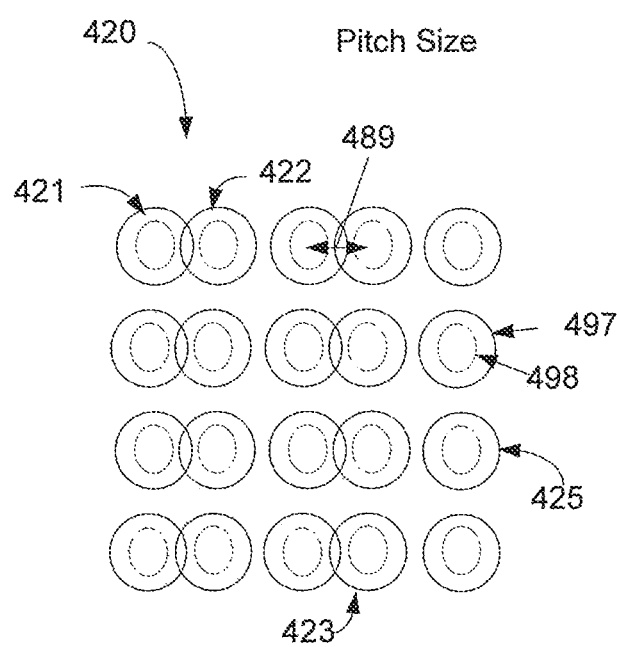

FIG. 4 is a block diagram of an exemplary memory cell array 410 layout without pMTJ overlap and an exemplary memory cell array 420 layout with pMTJ overlap in accordance with one embodiment. Memory cell array 410 includes a plurality of memory cells (e.g., memory cells 411, 412, 414, 415, etc). The layout illustrates the pitch size 488 as defined by lithography limitations. The solid circular lines (e.g., 477, 497, etc.) outlining the memory cells or dots represent the dot size after lithography. The figure also shows the size of the dots or memory cells after trimming. The broken circular lines (e.g., 478, 498, etc.) in the memory cells or dots represent the dot or pMTJ size after trimming. Memory cell array 420 includes a plurality of memory cells (e.g., memory cells 421, 422, 423, 425, etc). The layout illustrates the pitch size 489 is not tied to lithography limitations associated with the pMTJ. In one embodiment, the pitch size 489 corresponds to pitch limitations of components other than the pMTJ.

Figure 5:
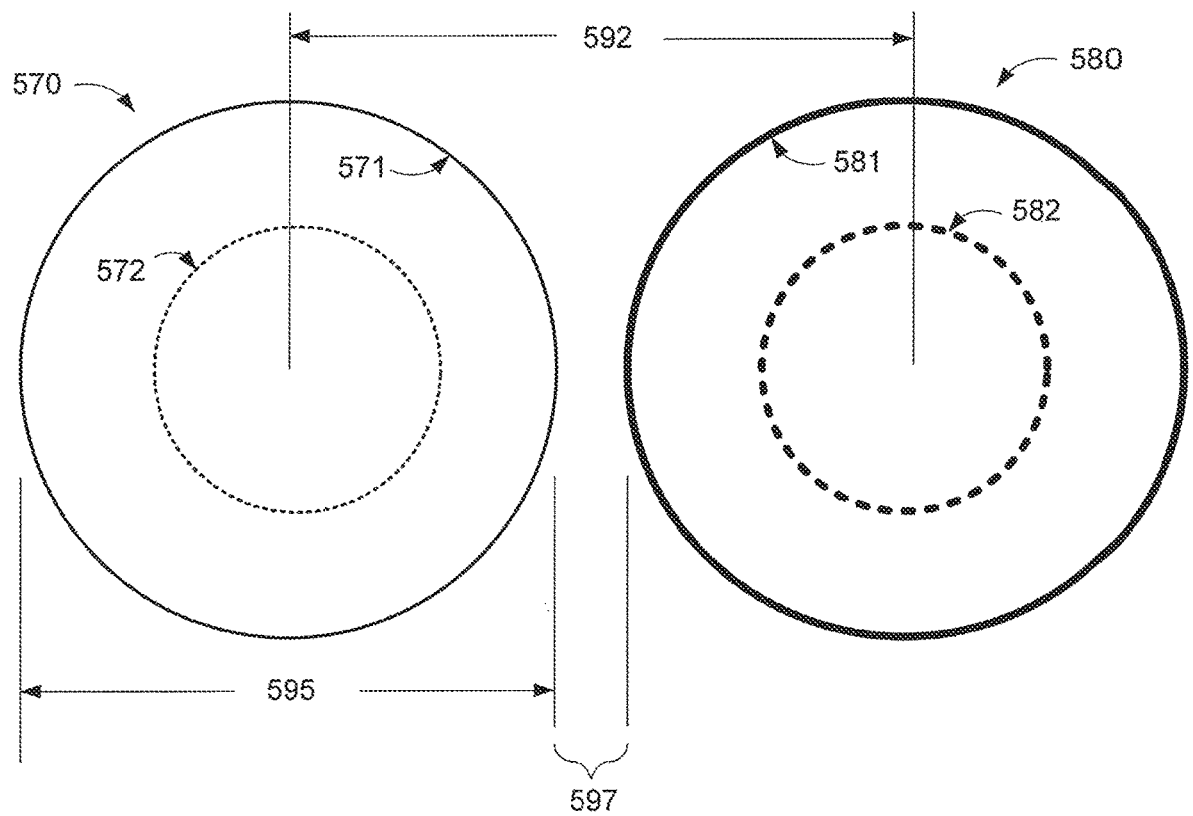
FIG. 5 is a block diagram top view comparison of two pMTJs that do not overlap and two pMTJs that do overlap in accordance with one embodiment.
Figure 5:
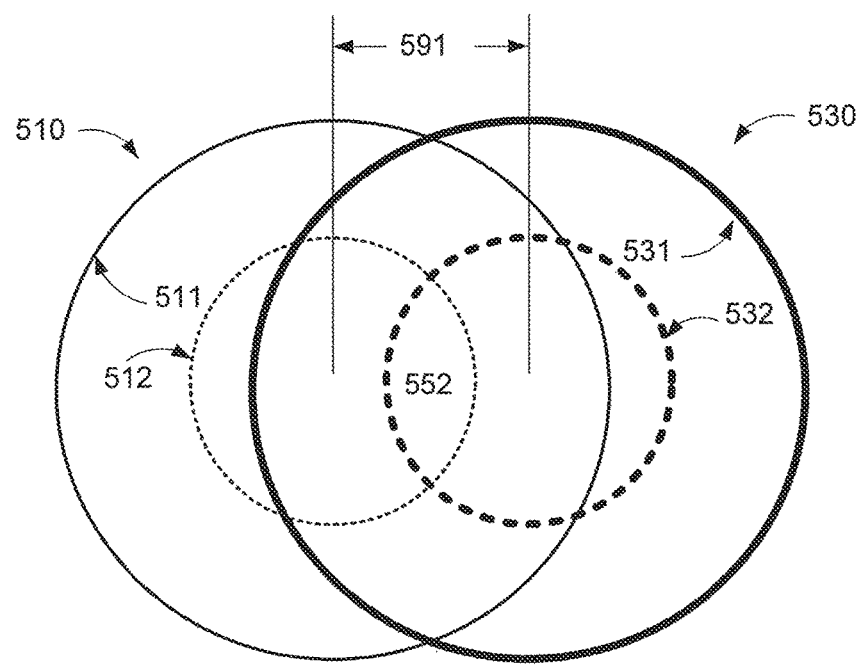

In one embodiment without overlap, the pitch size of the memory cells remains relatively constant or the same even though components or structures formed by an initial photo resist processes are trimmed significantly. FIG. 5 is a block diagram top view of two pMTJs 570 and 580 that do not overlap and two pMTJs 510 and 520 that overlap in accordance with one embodiment. The solid line 571 indicates the lithographic printing or formation boundaries of a pMTJ 570 in a fabrication level and the solid line 581 indicates the lithographic printing or formation boundaries of pMTJ 580 in the same fabrication level. The dashed line 572 indicates the trimming boundaries of pMTJ 510 and dashed line 582 indicates the trimming boundaries of pMTJ 520. The pitch 592 between pMTJ 570 and pMTJ 580 is determined by the pMTJ lithographic formation limitations or resolution 595 and the spacing limitation 597. The spacing limitation 597 can be influenced or adjusted to compensate for various factors (e.g., minimum spacing lithographic formation limitations, capacitance considerations, electrical interference, etc.).

The solid line 511 indicates the lithographic printing or formation boundaries of pMTJ 510 in one fabrication level and the solid line 531 indicates the lithographic printing or formation boundaries of pMTJ 530 in another fabrication level. The dashed line 512 indicates the trimming boundaries of pMTJ 510 in the first level and the dashed line 532 indicates the trimming boundaries of pMTJ 530 in the second level. The pMTJ 510 and pMTJ 530 still include an overlap 552 after trimming. The pitch 591 is smaller than pitch 592 as the pMTJs 510 and 530 associated with pitch 591 have an overlap and the pMTJs 570 and 580 associated with pitch 592 do not overlap.

In one embodiment, placement of a pMTJ can be configured based upon considerations or coordination associated with multiple pitch reference components. In one exemplary implementation, the placement of a pMTJ is configured based upon a lithographic limitation associated with formation of a switch and a lithographic limitation associated with the formation of a via. With reference back to FIG. 2, the placement of a pMTJ 232 can be configured based upon a lithographic limitation associated with formation of switches 234, 224, and 244 and a lithographic limitation associated with the formation of vias 223 and 243. For example, the placement of via 243 with respect to an edge of switch 244 may limit the placement of the pMTJ 232. If via 243 is limited to a location closer to the middle of the switch 244, this may limit the ability of pMTJ 232 to shift and thus may limit the overlap and resulting pitch.

Figure 6:
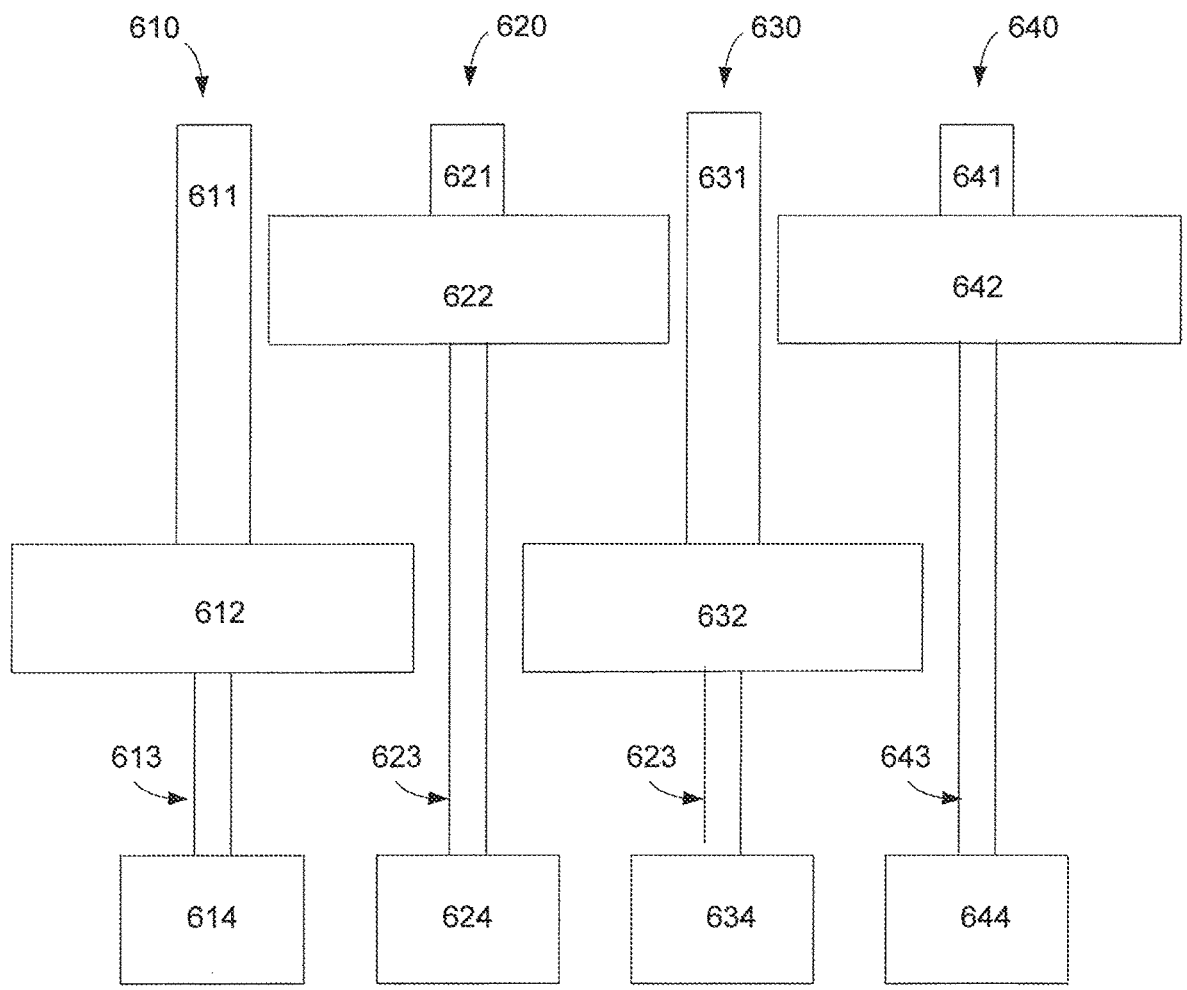
FIG. 6 is a block diagram of another exemplary configuration of a plurality of memory cells in accordance with one embodiment.

It is appreciated that configurations of pMTJ overlapping can vary. FIG. 6 is a block diagram of an exemplary memory cell array configuration 600 in accordance with one embodiment. Memory cell configuration 600 includes memory cells 610, 620, 630, and 640. Memory cell 610 includes contact 611, pMTJ 612, via 613, and switch 614. Memory cell 620 includes contact 621, pMTJ 622, via 623, and switch 624. Memory cell 630 includes contact 631, pMTJ 632, via 633, and switch 634. Memory cell 640 includes contact 641, pMTJ 642, via 643, and switch 644. The pMTJs 612 and 632 are in different layers than pMTJ 622 and 642. By overlapping the pMTJs in different levels, the pitch cell between memory cells 610, 620, 630, and 640 can be maintained based upon a reference pitch. A pMTJ on one level can overlap multiple pMTJs on another level. For example, pMTJ 622 in the second level overlaps pMTJs 612 and 632 in the first level, and pMTJs 622 and 642 in the second level overlap pMTJs 632.

Figure 7:
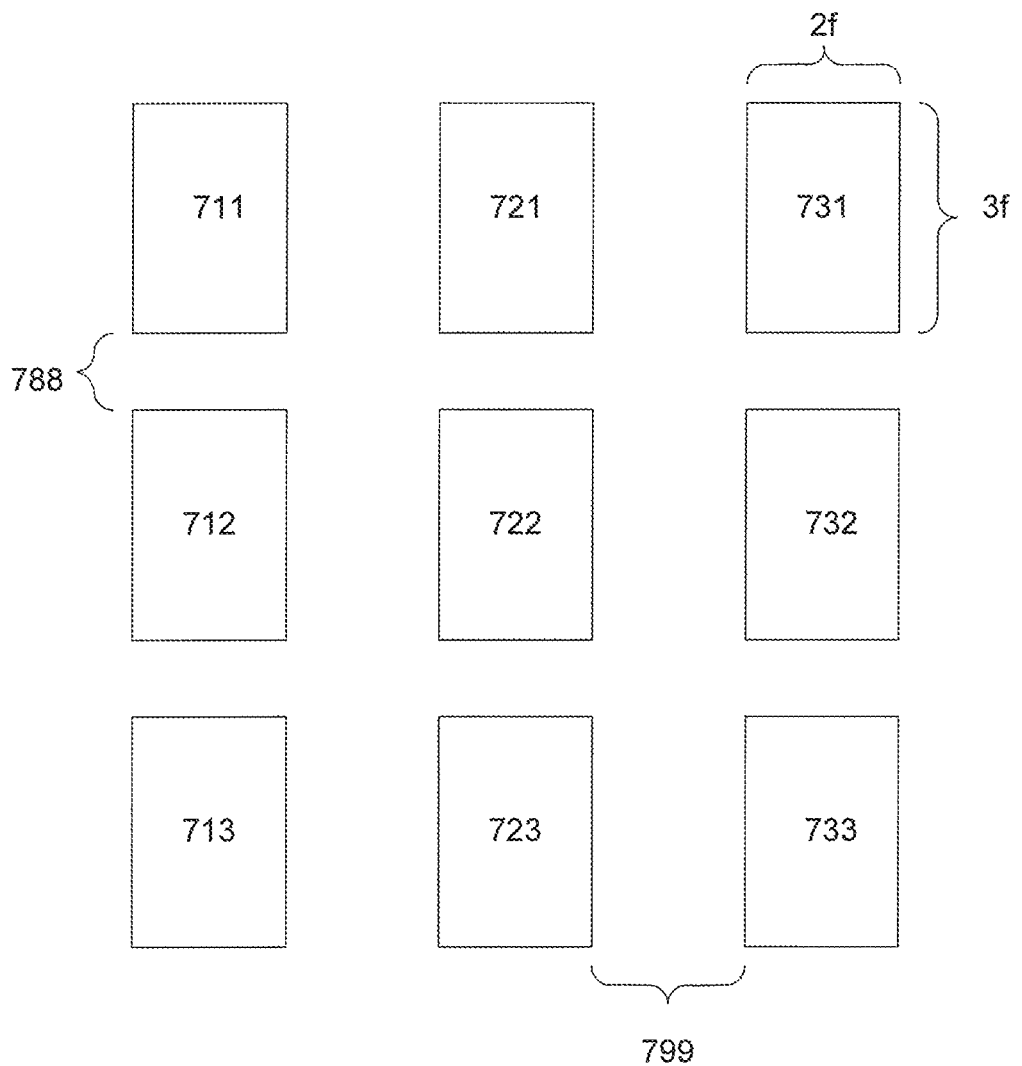
FIG. 7 is a block diagram top view of pitch reference components included in an array in accordance with one embodiment.

It is appreciated pitch reference component sizes may vary. In one embodiment, the locations of respective pMTJs in different levels and corresponding overlaps are coordinated to accommodate differences in pitch reference component sizes. FIG. 7 is a block diagram top view of pitch reference components included in an array in accordance with one embodiment. The pitch reference components include 711, 712, 713, 721, 722, 723, 731, 732, and 733. In one embodiment, the pitch reference components can have different shapes (e.g., square, rectangular, circular, etc.). In one exemplary implementation, pitch reference component 731 has a width of 2f in the x direction and a length of 3f in the y direction, where f is the minimum lithographic process distance or resolution available for the device fabrication. The minimum lithographic process distance or resolution available for the device fabrication can correspond to a line or trace width.

Figure 8:
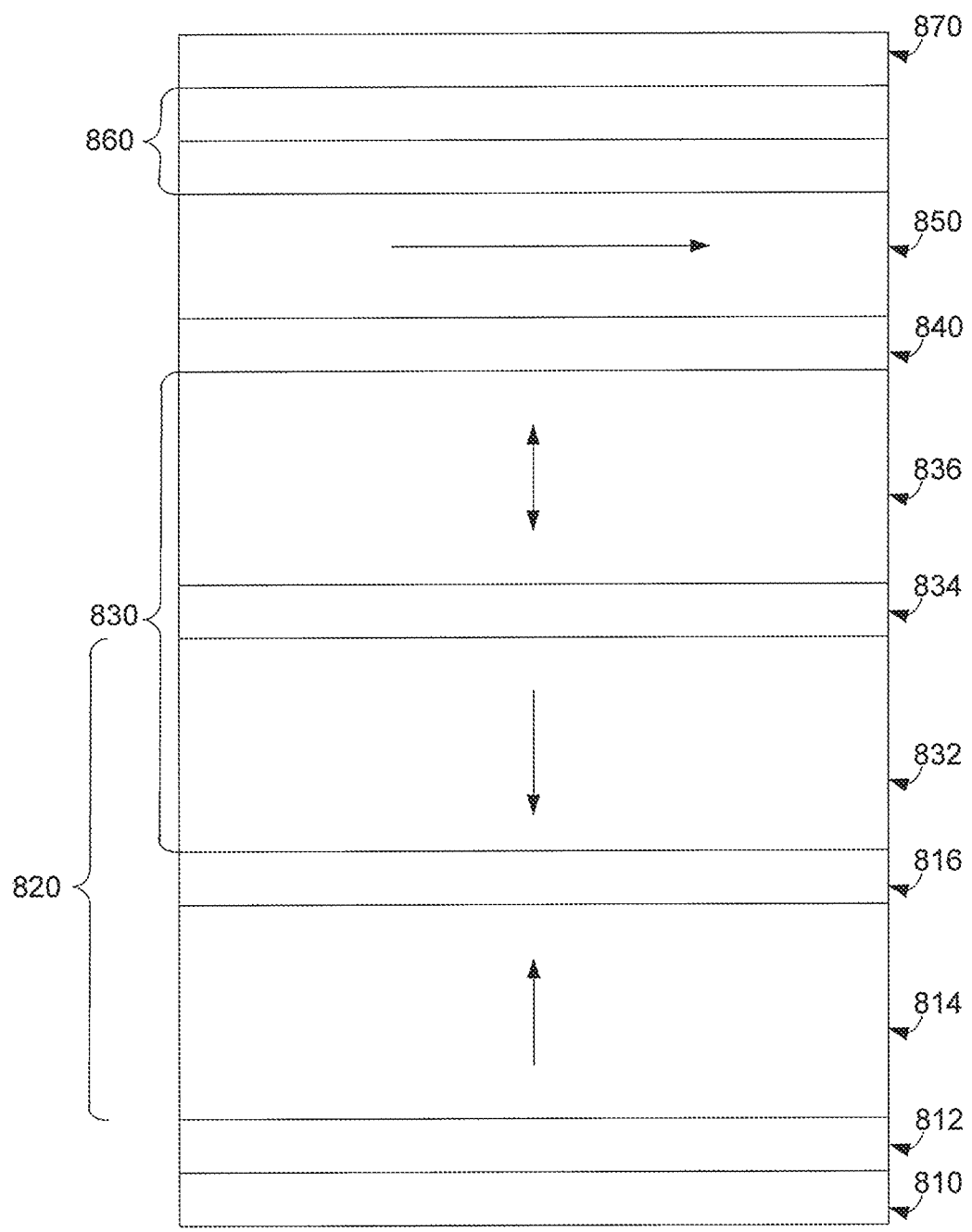
FIG. 8 illustrates a magnetic tunnel junction ("MTJ") in accordance with one embodiment.

FIG. 8 illustrates a magnetic tunnel junction ("MTJ") 800 in accordance with one embodiment. MTJ 800 includes one or more seed layers 810 provided at the bottom of stack 800 to initiate a desired crystalline growth in the above-deposited layers. An antiferromagnetic layer 812 is disposed over seed layers 810. MTJ 830 is deposited on top of synthetic antiferromagnetic (SAF) layer 820. MTJ 830 includes reference layer 832, which is a magnetic layer, a non-magnetic tunneling barrier layer (i.e., the insulator) 834, and the free layer 836, which is also a magnetic layer. It should be understood that reference layer 832 can actually be part of SAF layer 820, but forms one of the ferromagnetic plates of MTJ 830 when the non-magnetic tunneling barrier layer 834 and free layer 836 are formed on reference layer 832. As shown in FIG. 8, magnetic reference layer 832 has a magnetization direction perpendicular to its plane. As also illustrated in FIG. 8, free layer 836 also has a magnetization direction perpendicular to its plane, but its direction can vary by 180 degrees.

The first magnetic layer 814 is disposed over seed layer 810. SAF layer 820 also has an antiferromagnetic coupling layer 816 disposed over the first magnetic layer 814. Furthermore, a nonmagnetic spacer 840 is disposed on top of MTJ 830 and a polarizer 850 is disposed on top of the nonmagnetic spacer 840. Polarizer 850 is a magnetic layer that has a magnetic direction that may be parallel to its plane and orthogonal to the magnetic direction of the reference layer 832 and free layer 836. Polarizer 850 is provided to polarize a current of electrons ("spin-aligned electrons") applied to MTJ structure 830. A capping layer 860 can be provided on top of perpendicular polarizer 850 to protect the layers below on MTJ stack 800. Finally, a hard mask 870 is deposited over capping layers 860 and is provided to pattern the underlying layers of the MTJ structure 800, using a reactive ion etch (RIE) and ion beam etch processes. In one embodiment, the MTJ structure is similar to portions of a pMTJ (e.g., pMTJ 112, 122, 132, 142, 612, 622, 421, 422, etc.)

FIG. 9 is a flow chart of an exemplary fabrication method in accordance with one embodiment.

In block 910, switch structures are formed. In one embodiment, the switches are transistors. The transistors can be a complimentary metal oxide silicon (CMOS) transistors. In one exemplary implementation, a switch is configured to selectively operate a memory cell during various activities (e.g., read, write, erase, etc.).

In block 920, conductor vias are formed. The conductor vias are coupled to the switches. In one embodiment, formation of the conductor vias include, leveling or smoothing off (e.g., CMP, etc.) the top of the vias, depositing an insulation layer (e.g., oxide, etc.), etching a via space in the insulation layer, and filling the space in with a via conductor (e.g., metal, etc.).

In block 930, MTJ structures or components are formed. One group of MTJ structures are formed in one layer of the semiconductor and another group of MTJ structures is form in another layer. The location of portions of the MTJ structure formed in one layer and portions of the MTJ structure formed in the other layer can be coordinated based upon a reference pitch. Portions of the MTJ structure formed in one layer can overlap portions of the MTJ structure formed in the other layer. The MTJ structures are coupled to the vias. In one embodiment, the MTJ structures are coupled to the vias in an alternating pattern so that groups of MTJs from different layers are coupled to every other switch structure respectively in an X and Y planar direction. In one embodiment, the MTJs are formed in a circular or pillar configuration. In one exemplary implementation, the formation of the MTJs can include magnetic material deposition (pMTJ), hard mask deposition, pMTJ annealing, photolithography for pillar definition, reactive ion retching of hard mask, ion beam etching of the pMTJ to form pillars, insulator deposition and smoothing the surface with CMP (chemical mechanical polishing) for the next level of pMTJ formation and so on.

In block 940, contacts are formed. The contacts are coupled to the MTJs.

It is appreciated that multiple layers of MTJs can be fabricated. It is appreciated, there can be more than 2 layers or levels (e.g., 3, 4, 5, etc.) than include MTJs, pMTJs, and so on. Again, it is appreciated MTJs in different levels can be configured or located based upon a reference pitch. MTJs in different levels can include overlapping portions. It is appreciated other components of the memory cell (e.g., switches, transistors, vias, contacts, traces, etc.) can be included in multiple levels. The components (e.g., switches, transistors, vias, contacts. traces, etc.) can be configured or located based upon a reference pitch. Components in different levels can include overlapping portions. In one embodiment, similar lithographic mask patterns are utilized to form different layers of MTJs. In one exemplary implementation, similar lithographic masks utilized to form layers in which MTJs overlap, except the respective lithographic masks include an offset in the patterns of another and the offset corresponds to the overlap. The MTJ fabrication in multiple layers can include multiple anneal processes. In one exemplary implementation, the number of MTJ layers is coordinated and balanced with impacts associated with the annealing processes.

Various processes can be utilized to fabricate a memory cell. In one embodiment, a fabrication process utilized to form a portion of a memory cell can have a greater resolution limitation than another fabrication process utilized to form another portion of the memory cell.

FIG. 10 is a flow chart of exemplary fabrication processes in accordance with one embodiment.

In block 1010, a portion of one memory cell is fabricated in a layer of a semiconductor. The portion is fabricated using one fabrication process that has a first set of fabrication limitations. The set of limitations can be resolution limitations. The set of limitations can correspond to the type of fabrication process. The fabrication process can be a lithographic process. The lithographic process can include an ion beam etch process, a plasma etch process, a reactive etch process, and so on. In one embodiment, the portion of the memory cell can be a subcomponent. The memory cell subcomponent can be a switch, via, and so on. In one exemplary implementation, the portion overlaps a portion of another memory cell. The portion can be in a different layer as the portion of the of the other memory cell. In one exemplary implementation, the portion does not overlap a portion of another memory cell. The portion can be in the same layer as the portion of the of the other memory cell. The overlapped portion of the other memory cell is in a different layer.

In block 1020, another portion of the memory cell is fabricated. The other portion is fabricated using a fabrication process that has a second set of fabrication limitations. The second set of fabrications limitations can include different resolution limitations than the first set of fabrication limitations. The set of limitations can correspond to the type of fabrication process. The fabrication process can be a lithographic process. The lithographic process can include an ion beam etch process, a plasma etch process, a reactive etch process, and so on. In one embodiment, the portion of the memory cell can be a subcomponent. The memory cell subcomponent can be a pMTJ. The portion can be fabricated to overlap a portion of another memory cell. The overlapped portion of the other memory cell is in a different layer.

FIG. 11 is a flow chart of memory fabrication method 1100 in accordance with one embodiment. In one exemplary implementation, the location of a second pMTJ and a first pMTJ with respect to one another is coordinated based upon a reference pitch distance. The reference pitch distance can be based upon a pitch between a first pitch reference component and a second pitch reference component. In one embodiment, lithographic printing capabilities with respect to the first pitch reference component and the second pitch reference component is used to set or determine the reference pitch.

In block 1110, a first pitch reference component is formed. The first pitch reference component can be a switch. The reference component size can be based upon a minimum lithographic processing dimension. The reference component size can be reduced and based upon a minimum trimming processing dimension.

In block 1120, a second pitch reference component is formed. The second pitch reference component can be a switch. The reference component size can be based upon a minimum lithographic processing dimension.

In block 1130, a first pillar magnetic tunnel junction (pMTJ) located in a first level in a semiconductor device is formed using a first run lithographic process. The first pitch reference component is coupled to the first pMTJ.

In block 1140, a second pillar magnetic tunnel junction (pMTJ) located in a second level in the semiconductor device if formed using a second run lithographic process. The second pitch reference component is coupled to the second pMTJ.

In one embodiment, the location of the second pMTJ with respect to the first pMTJ is coordinated to comply with a reference pitch for memory cells. The location of the second pMTJ and the second pMTJ with respect to each other and a plane perpendicular to the first level and the second level can be coordinated to comply with a reference pitch for the memory cells. A portion of the second MTJ can overlap a portion of the first MTJ and the plane perpendicular to the first level and the second level traverses the overlap. There can be a space between the second MTJ and the first MTJ, and the plane perpendicular to the first level and the second level traverses the space. Respective edges of the second MTJ and the first MTJ are aligned along the plane perpendicular to the first level and the second level. The MTJs can be included in a pillar configuration and included in pMTJs.

In one embodiment, a portion of the second pMTJ overlaps a portion of the first pMTJ wherein the overlap corresponds to an offset in pattern difference between the first level and the second level. A first lithographic mask can be utilized to form the first pMTJ and a second lithographic mask can be utilized to form the second pMTJ, wherein lithographic patterns for forming the first pMTJ and second pMTJ are the same except they are offset from one another to correspond to the overlap.

In one embodiment, a minimum lithographic processing dimension associated with the first pitch reference component and the second pitch reference component is less than a minimum/lithographic processing dimension associated with the first pMTJ and the second pMTJ. The fabrication processes utilized to form the first pitch reference component and the second pitch reference have a greater resolution than fabrication processes utilized to form the first pMTJ and second pMTJ. The smallest dimension can correspond to a conductive line trace. The pMTJs can be formed using a hard mask and ion beam etch. The first pMTJ and the second pMTJ can also be trimmed. In one embodiment, the memory cells are included in memory cell array of a memory device. The memory device can be a magnoresistive random access memory (MRAM).

Embodiments of the present invention can facilitate efficient and effective memory cell density configuration. In one embodiment, MTJ components of a memory cell are configured in different levels and the pitch between the MTJ components of between memory cells can be adjusted or based upon a reference pitch. The reference pitch can correspond to components formed by processes that facilitate relatively tight or close pitches. In one exemplary implementation, the reference pitch can be narrower than pitches otherwise associated with traditional magnetic memory cell formation. The closer or tighter pitches can enable increased memory cell density. The increased memory cell density in turn can enable greater information storage per device area.

Some portions of the detailed descriptions are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

It is appreciated that embodiments of the present invention can be compatible and implemented with a variety of different types of tangible memory or storage (e.g., RAM, DRAM, flash, hard drive, CD, DVD, etc.). The memory or storage, while able to be changed or rewritten, can be considered a non-transitory storage medium. By indicating a non-transitory storage medium it is not intend to limit characteristics of the medium, and can include a variety of storage mediums (e.g., programmable, erasable, nonprogrammable, read/write, read only, etc.) and "non-transitory" computer-readable media comprises all computer-readable media, with the sole exception being a transitory, propagating signal.

It is appreciated that the specification includes a listing of exemplary concepts or embodiments associated with the novel approach. It is also appreciated that the listing is not exhaustive and does not necessarily include all possible implementation. The concepts and embodiments can be implemented in hardware. In one embodiment, the methods or process describe operations performed by various processing components or units. In one exemplary implementation, instructions, or directions associated with the methods, processes, operations etc. can be stored in a memory and cause a processor to implement the operations, functions, actions, etc.

It is appreciated that a memory storage management systems and methods can include the exemplary concepts or embodiments. It is also appreciated that the listing is not exhaustive and does not necessarily include all possible implementations. The concepts and embodiments can be implemented in hardware, firmware, software, and so on. In one embodiment, the following concepts include methods or processes that describe operations performed by various processing components or units. In one exemplary implementation, instructions or directions associated with the methods, processes, operations etc. can be stored in a memory and cause a processor to implement the operations, functions, actions, etc.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents. The listing of steps within method claims do not imply any particular order to performing the steps, unless explicitly stated in the claim.

What is claimed is:

1. A method comprising:
   forming a first pitch reference component;
   forming a second pitch reference component;
   forming a first pillar magnetic tunnel junction (pMTJ) located in a first level in the semiconductor device using a first run lithographic process; and
   forming a second pillar magnetic tunnel junction (pMTJ) located in a second level in the semiconductor device using a second run lithographic process;
   wherein the location of the second pMTJ with respect to the first pMTJ is coordinated based upon a reference pitch distance between the first pitch reference component and second pitch reference component.

2. The method of claim 1, wherein the first pitch reference component is a first switch coupled to the first pMTJ and the second pitch reference component is a second switch coupled to the second pMTJ.

3. The method of claim 2, wherein the first reference component is a first switch and the second reference component is a second switches.

4. The method of claim 1, wherein the reference component size is based upon a minimum lithographic processing dimension.

5. The method of claim 1, wherein the reference component size is based upon a minimum trimming processing dimension.

6. The method of claim 1, wherein a minimum lithographic processing dimension associated with the first pitch reference component and the second pitch reference component is less than a minimum lithographic processing dimension associated with the first pMTJ and the second pMTJ.

7. The method of claim 1, wherein the smallest dimension corresponds to a conductive line trace.

8. The method of claim 1, wherein the pMTJs are formed using a hard mask and ion beam etch.

9. The method of claim 1, wherein the first pMTJ and the second pMTJ overlap each other.

10. A method comprising:
    forming a first pillar magnetic tunnel junction (pMTJ) located in a first level in the semiconductor device, wherein the first pMTJ is associated with a first memory cell; and
    forming a second pillar magnetic tunnel junction (pMTJ) located in a second level in the semiconductor device, wherein the second pMTJ is associated with a second memory cell;
    wherein the location of the second pMTJ with respect to the first pMTJ is coordinated based upon a reference pitch distance.

11. The method of claim 10, further comprising;
    forming a first pitch reference component, wherein the first pitch reference component is associated with the pMTJ memory cell, and
    forming a second pitch reference component, wherein the second pitch reference component is associated with the second pMTJ memory cell, wherein a pitch between the first pitch reference component and the second pitch reference component is used to determine the reference pitch.

12. The method of claim 11, wherein fabrication processes utilized to form the first pitch reference component and the second pitch reference have a greater resolution than fabrication processes utilized to form the first pMTJ and second pMTJ.

13. The method of claim 10, wherein a portion of the second pMTJ overlaps a portion of the first pMTJ and the overlap is coordinated to comply with a reference pitch associated with other components, and an offset in pattern difference between the first level and the second level corresponds to the offset.

14. The method of claim 10, wherein a first lithographic mask is utilized to form the first pMTJ and a second lithographic mask is utilized to form the second pMTJ, wherein lithographic patterns for forming the first pMTJ and second pMTJ are the same except they are offset from one another to correspond to the overlap.

15. The method of claim 10, wherein the lithographic printing capabilities with respect to the first pitch reference component and the second pitch reference component is used to set the reference pitch.

16. The method of claim 10, wherein the first pitch reference component is a first switch coupled to the first pMTJ and the second pitch reference component is a second switch coupled to the second pMTJ.

17. A method of forming a memory cell array in a memory device, the method comprising:
   forming a first memory cell with a first magnetic tunnel junction (MTJ) located in a first level; and
   forming a second memory cell with a second magnetic tunnel junction (MTJ) located in a second level, wherein a pitch between the second pMTJ and first pMTJ is based upon a reference pitch.

18. The method of claim 17, wherein a third component is included in the first memory cell and a fourth component is included in the second memory cell, wherein the reference pitch is based upon a pitch between the third component and fourth component.

19. The method of claim 17, wherein respective edges of the first pMTJ and second pMTJ are located with respect to a plane perpendicular to the first and second level.

20. The method of claim 19, wherein a portion of the first pMTJ and a portion of the second pMTJ overlap each other and the plane perpendicular to the first and second level traverses the overlap.

21. The method of claim 19, wherein a portion of the first pMTJ and a portion of the second pMTJ have a space between each other and the plane perpendicular to the first and second level, and the plane perpendicular to the first and second level traverses the space.

22. The method of claim 19, wherein respective edges of the first pMTJ and the second pMTJ are aligned with the plane perpendicular to the first and second level.

23. A method of claim 17 wherein the memory device is a magnoresistive random access memory (MRAM).

* * * * *